United States Patent

Schultz et al.

[11] Patent Number: 5,807,062
[45] Date of Patent: Sep. 15, 1998

[54] ARRANGEMENT FOR HANDLING WAFER-SHAPED OBJECTS

[75] Inventors: Klaus Schultz; Harald Beckert; Berndt Lahne, all of Jena; Manfred Heinze, Dresden, all of Germany

[73] Assignee: Jenoptik Aktiengesellschaft, Jena, Germany

[21] Appl. No.: 663,487

[22] Filed: Jun. 13, 1996

[30] Foreign Application Priority Data

Dec. 28, 1995 [DE] Germany ............... 195 49 045.2

[51] Int. Cl.[6] .................................................. B65G 49/07
[52] U.S. Cl. ................................. 414/744.2; 414/941
[58] Field of Search .............................. 414/217, 744.3, 414/937, 939, 941, 744.2; 74/30, 33, 88, 89, 89.12, 89.17

[56] References Cited

U.S. PATENT DOCUMENTS

| | | |
|---|---|---|
| 3,968,885 | 7/1976 | Hassan et al. . |
| 4,108,578 | 8/1978 | Corey ............................ 74/30 X |
| 4,643,627 | 2/1987 | Bednorz et al. ............. 414/939 X |
| 4,781,511 | 11/1988 | Harada et al. .............. 414/939 X |
| 4,811,617 | 3/1989 | Whiteman, Jr. ............ 74/89.17 X |
| 4,951,601 | 8/1990 | Maydan et al. ............. 414/217 X |
| 5,020,475 | 6/1991 | Crabb et al. ................ 414/217 X |
| 5,076,205 | 12/1991 | Vowles et al. .............. 414/217 X |
| 5,288,379 | 2/1994 | Namiki et al. .............. 414/217 X |
| 5,310,410 | 5/1994 | Begin et al. ................ 414/939 X |
| 5,404,894 | 4/1995 | Shiraiwa ..................... 414/217 X |
| 5,474,410 | 12/1995 | Ozawa et al. ............... 414/217 |
| 5,611,655 | 3/1997 | Fukasawa et al. .......... 414/217 |
| 5,628,828 | 5/1997 | Kawamura et al. ........ 414/217 X |
| 5,642,978 | 7/1997 | Lahne et al. ................ 414/331 |

FOREIGN PATENT DOCUMENTS

| | | |
|---|---|---|
| 9307263 | 9/1993 | Germany . |
| 4310149 | 10/1994 | Germany . |
| 4408537 | 9/1995 | Germany . |
| 93660 | 4/1989 | Japan ........................... 74/30 X |
| 3109727 | 5/1991 | Japan ......................... 414/939 |
| 3274746 | 12/1991 | Japan ......................... 414/941 |

*Primary Examiner*—James W. Keenan
*Attorney, Agent, or Firm*—McAulay Nissen Goldberg Kiel & Hand, LLP

[57] ABSTRACT

An arrangement for handling wafer-shaped objects is to ensure a high degree of positioning accuracy with increased productivity, freely selectable transport paths, and low mechanical expenditure under SMIF conditions. The arrangement has at least one indexing device for supplying and accepting the objects at a supplying and accepting location situated in a handling plane and at least one transporting device for transporting the wafer-shaped objects between the supplying and accepting location and a work station. The work station, together with at least one other work station, is arranged substantially coaxially to a central point through which passes a rotational axis of a changer. The arrangement is applicable in the manufacture of integrated circuits.

7 Claims, 5 Drawing Sheets

ARRANGEMENT FOR HANDLING WAFER-SHAPED OBJECTS

BACKGROUND OF THE INVENTION a) Field of the Invention

The invention is directed to an arrangement for handling wafer-shaped objects with at least one indexing device for supplying and accepting the objects at a supplying and accepting location situated in a handling plane and at least one transporting device for transporting the wafer-shaped objects between the supplying and accepting location and a work station.

b) Description of the Related Art

Due to steadily decreasing structural widths and consequent stricter requirements with respect to the cleanness of the environment surrounding the semiconductor wafers to be processed, local clean rooms are being used to an increasing extent for semiconductor manufacturing. With regard to the handling design concepts required for SMIF technique, systems which only contact the rear side of the semiconductor wafers for transporting purposes have gained acceptance in recent years. Further, it is required to use transport systems which remove the cassettes from a container in the vertical direction. A system which is suitable for this purpose is described, for instance, in DE 43 10 149 A1.

It is disadvantageous that a design of this type limits the transporting and preparing times for semiconductor wafers and that the positioning accuracy required for some work stations can only be achieved at considerable cost or at limited speeds due to high gear reduction ratios.

This is also especially true when a transport system having at least one input/output location deposits semiconductor wafers at a work station in the oriented state and transports them back to one of the output locations after the work is concluded and when there are other stations, in addition to the input/output stations, which are assigned preparatory tasks.

A typical work station can be a stage or table system of an inspection device, for example. Supplementary stations for aligning the semiconductor wafer or for identifying a code arranged on the wafer can be used. There is a positive effect on flexibility when the transport path of the semiconductor wafers can be freely selected.

OBJECT AND SUMMARY OF THE INVENTION

Therefore, a primary object of the present invention is to ensure a high degree of positioning accuracy with increased productivity, freely selectable transport paths, and low mechanical expenditure under SMIF conditions.

This object is met, according to the invention, by an arrangement for handling wafer-shaped objects with at least one indexing device for supplying and accepting the objects at a supplying and accepting location situated in a handling plane and at least one transporting device for transporting the wafer-shaped objects between the supplying and accepting location and a work station in that the work station, together with at least one other work station, is arranged substantially coaxially to a central point through which passes a rotational axis of a changer.

For the purpose of a highly precise positioning of its changer arms at the work stations in order to transfer objects from one work station to the other, the changer has a step drive for rough positioning as well as means for reproducible positioning in at least one reference position.

A coding device can be used for rough positioning. The location information relating to the work stations and the instantaneous assignment of the changer arms to the work stations is determined by the coding device by means of multiple-track coding.

A pair of toothed-rack portions is advantageously provided for reproducible positioning of the changer in the reference position. These toothed-rack portions are displaceable relative to one another and engage in a toothed wheel of identical pitch which is fitted to a central axle serving as rotational axis.

It is also advantageous that the toothed-rack portions are gripping elements of a parallel gripper which is extensible vertically to its effective line of force and which is rotatable about an axis Y—Y which is directed parallel to the rotational axis in the opposite direction of the gripping elements in a bearing which is guided on a linear guide vertically to the rotational axis.

In order to ensure an unlimited rotational angle of the changer, there is a vacuum feed to vacuum holding devices at the changer arms in the interior of the central axle which serves as the rotational axis. Connections in the interior of the central axle are coupled, via a sealing system, with stationary vacuum connections outside the central axle.

Every indexing device is fitted to a vertically adjustable platform for vertical movement between two planes which are situated one above the other. One plane lies at an ergonomic loading height and the other plane lies in the region of the handling plane so that the indexing devices and the transporting devices can act effectively.

Finally, the sides of the indexing devices which are designed so as to be open for purposes of the handling process are advantageously guided in an adequately sealing labyrinth system.

The invention will be explained more fully in the following with reference to the schematic drawing.

DESCRIPTION OF THE PREFERRED EMBODIMENTS

Figure 1:
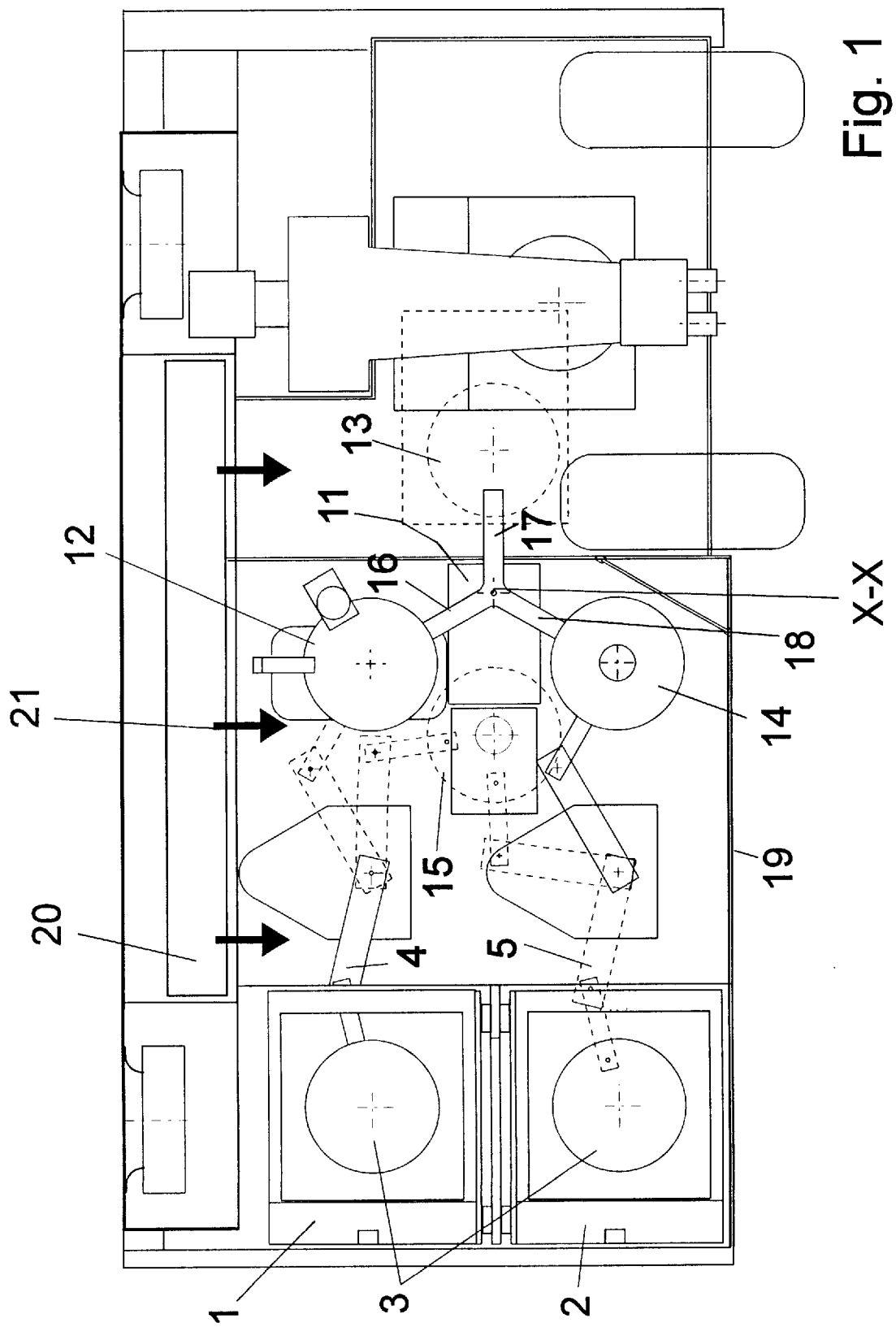
FIG. 1 shows a top view of a handling arrangement.
Figure 2:
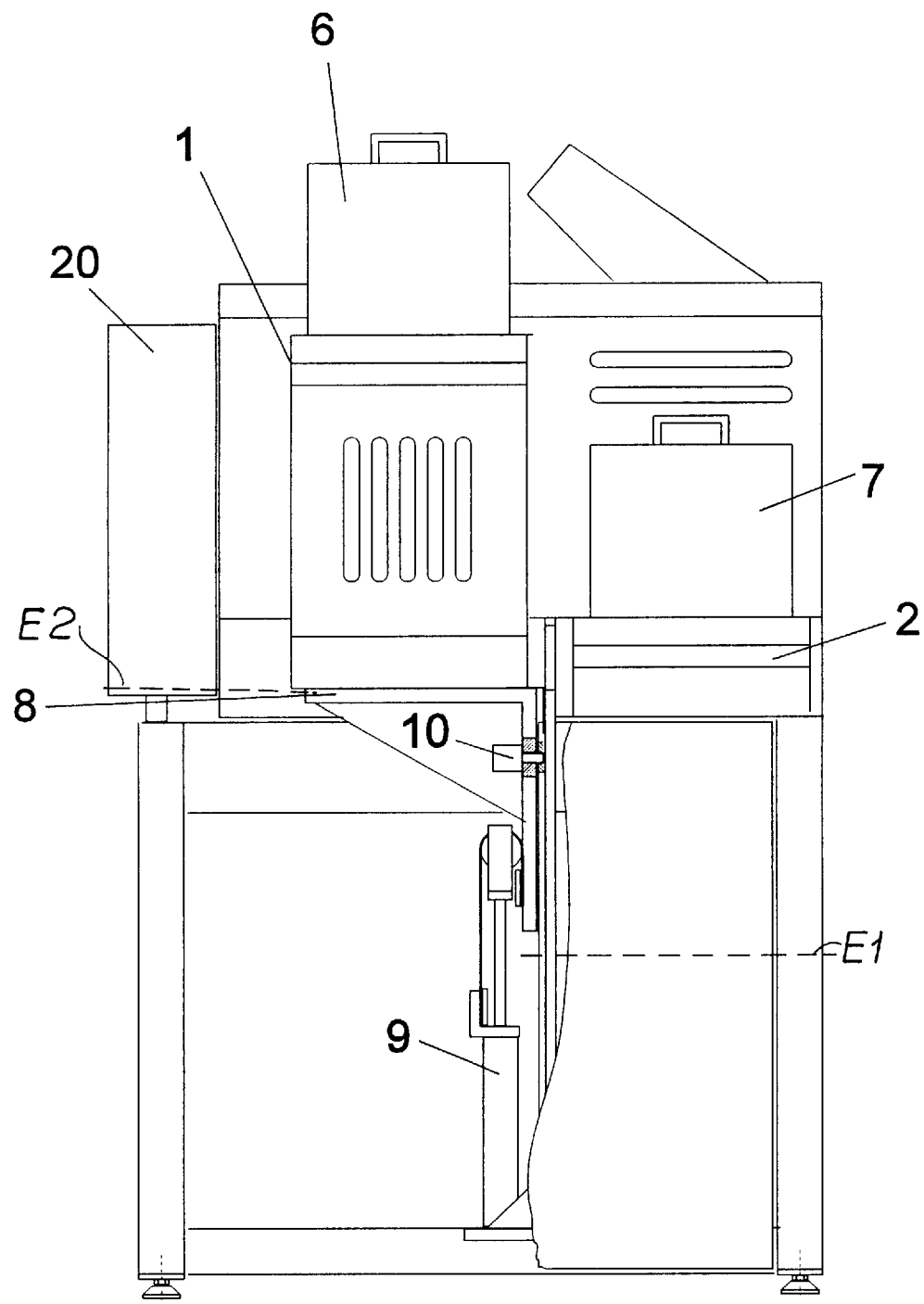
FIG. 2 shows a side view of the handling arrangement.

Two input and output devices 1 and 2 are provided in the arrangement of a handling system which is shown schematically in FIGS. 1 and 2. Wafer-shaped objects 3, e.g., semiconductor wafers (or masks), can be removed from and redeposited in these input and output devices 1 and 2 by transporting devices 4 and 5. The input and output devices 1, 2 are indexing devices by means of which the shelves of a magazine, which is removable from magazine containers 6, 7 under clean room conditions in accordance with the SMIF principle, can be adjusted so as to be indexed vertically relative to a handling plane in which the transporting devices 4, 5 act. In this way the objects 3 located in the shelves are made available in the handling plane and their return to the shelves is ensured.

The indexing devices themselves are attached to platforms, one of which platforms 8 is visible, for vertical movement between two planes which are situated one above the other. Both platforms have elevator drives 9. A locking cylinder 10 serves to secure the platforms. Whereas the one plane situated at an ergonomic height serves for loading with the magazine containers 6, 7, the other plane lies in the region of the handling plane so that the indexing devices and the transporting devices 4, 5 can act effectively. The clean room conditions remain unimpaired during the vertical displacement since the sides of the indexing devices which are designed so as to be open for the handling process are guided in an adequately sealing labyrinth system (not shown).

Work stations 12, 13 and 14 are provided substantially coaxially to a central point through which a rotational axis X—X of a changer 11 passes. In the present example, work station 12 is an arrangement for the orientation of the semiconductor wafer in a plane and at an angle, work station 13 is the stage of an inspection microscope, and work station 14 is a work station for visual total-field inspection. Another station 15, to which both transporting devices 4, 5 have access, is also arranged at the same distance from the central point. While the other work stations 12, 13, 14 are advantageously arranged at an angular distance of 120°, station 15 lies in an intermediate position.

A highly effective and flexible handling of objects 3 between the various work stations 12, 13, 14 is ensured by means of the arrangement of the work stations 12, 13, 14 and station 15 and by the use of indexing devices for supplying the objects so that ineffectual movements of the transporting devices 3, 4 are avoided. The objects 3 can be removed from any of the input and output devices 1, 2 as required or can be returned to the same device or to another respective device. Station 15 serves as an intermediate depositing location from which an object 3 which is deposited by one transporting device can be picked up by the other transporting device. The changer 11 which comprises changer arms 16, 17, 18 arranged at an offset of 120° relative to one another ensures an optional transfer of objects 3 between the work stations 12, 13, 14 as a result of its ability to rotate toward either side.

The entire device is enclosed by a housing 19 whose interior is divided substantially into two partial spaces located one above the other. While the upper partial space serves as a handling space, a majority of the driving elements is accommodated in the lower partial space. An air processing installation 20 serves to generate pure air which flows through the partial spaces as a low-turbulence air flow 21. In particular, a flow component which is generated in accordance with DE 43 10 149 A1 and is directed from the upper partial space to the lower partial space prevents particles from penetrating into the handling space.

As a result of its design in accordance with the arrangement, the changer 11, whose changer arms 16, 17, 18 correspond in quantity to the work stations 12, 13, 14, is capable of handling objects 3 not only in a highly effective and flexible manner but also with positional accuracy.

Figure 3:
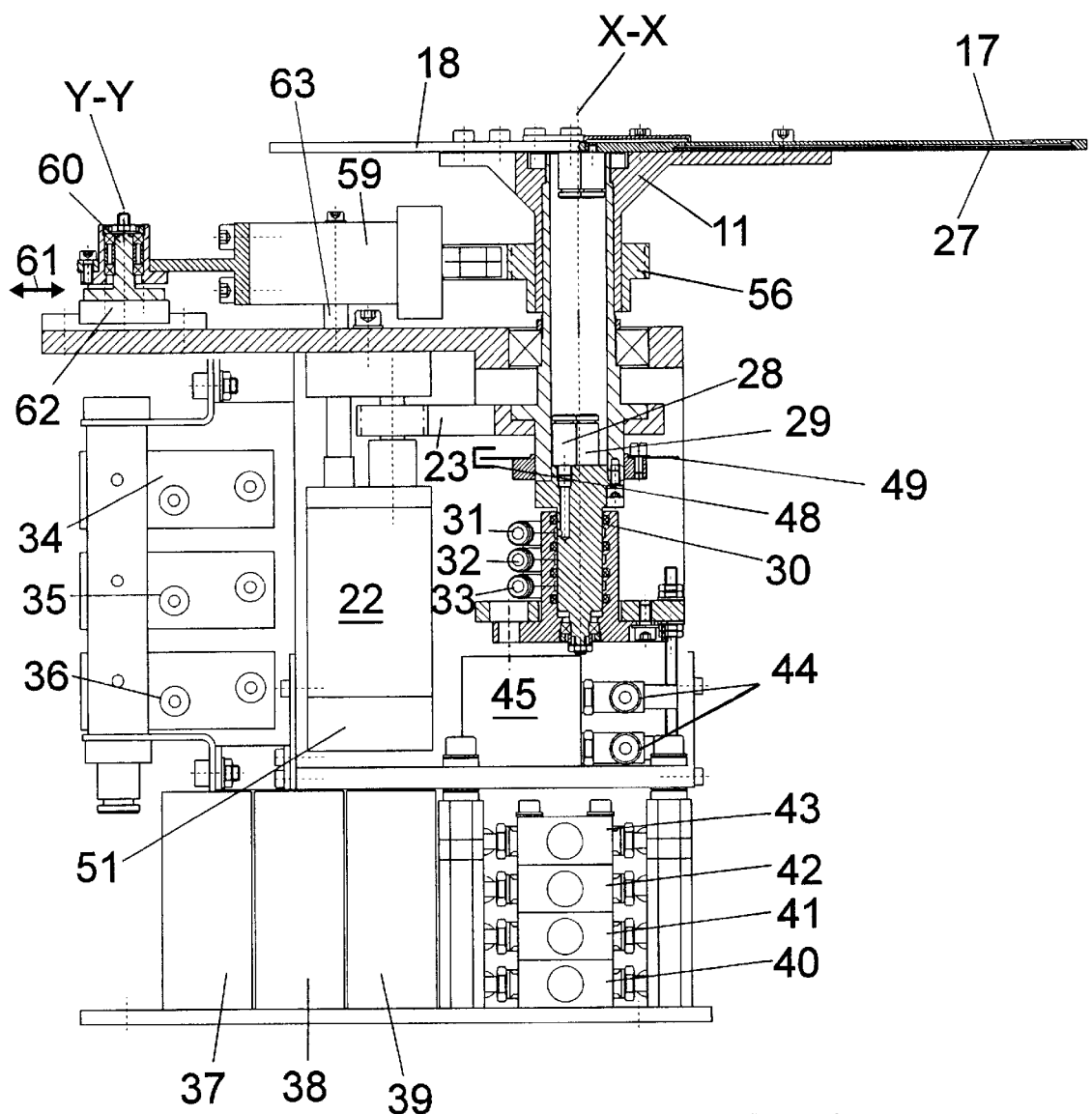
FIG. 3 shows a side view of a changer, partially in section.
Figure 4:
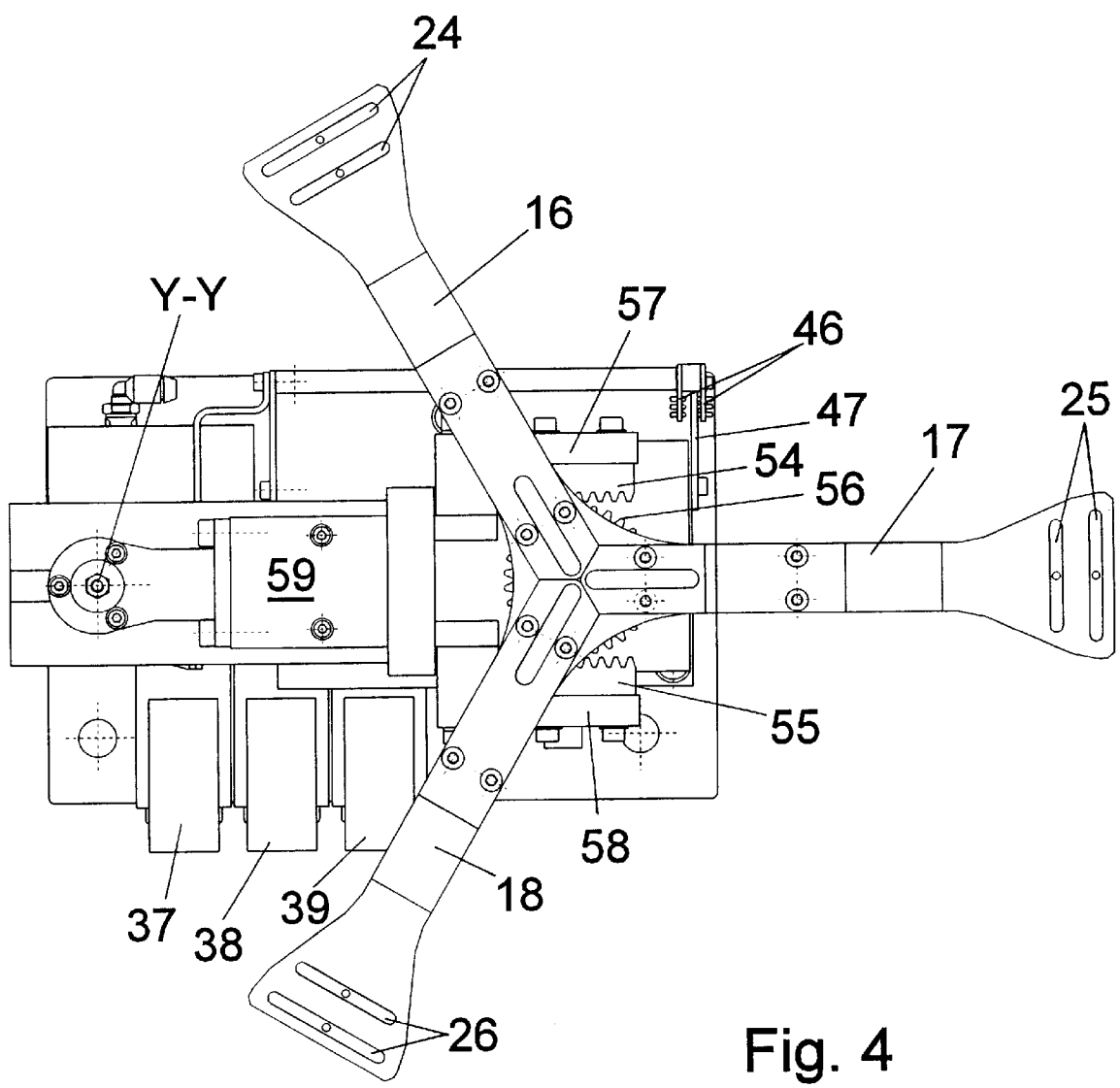
FIG. 4 shows a top view of the changer.
Figure 5:
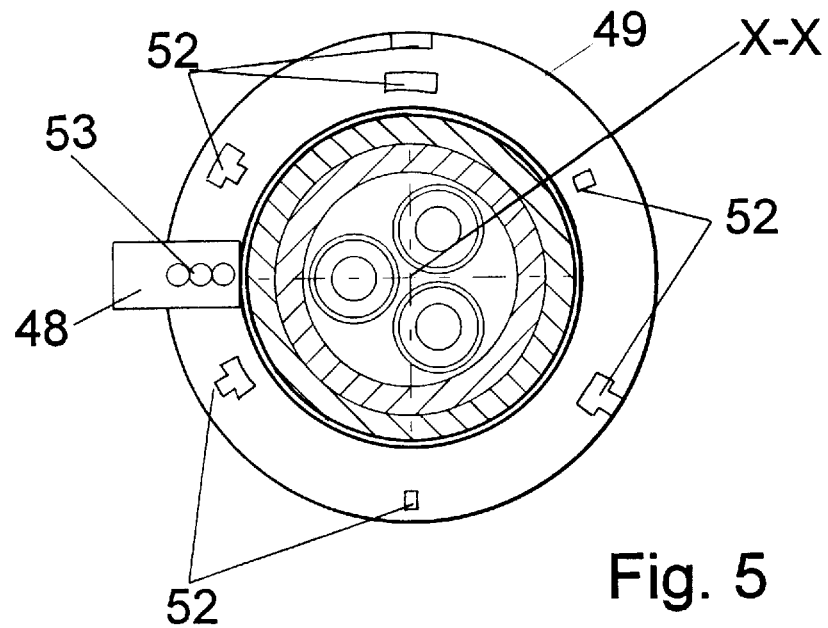
FIG. 5 shows a coding device for rough positioning of the changer.
Figure 6:
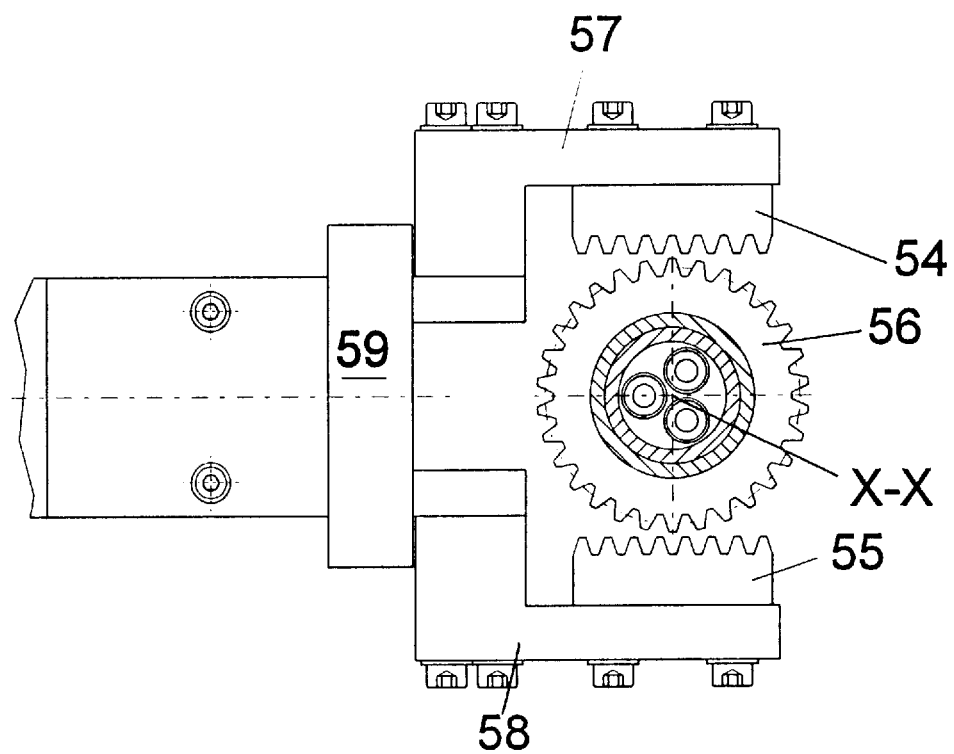
FIG. 6 shows a device for precision positioning of the changer.

The construction, according to the invention, which is shown in FIGS. 3 to 5 is useful for this purpose. A motor 22 with an associated synchronous belt drive 23 is provided for driving the changer 11 (in the present case in 120-degree steps), the changer 11 being rotatable in both directions. The changer arms 16, 17, 18 contain vacuum holding devices 24, 25 and 26 at their front ends and ducts which extend in their interior, only one duct 27 being shown in the drawing.

In order to ensure an unlimited rotational angle of the changer 1, the vacuum feed to the ducts is effected via hose connections, not shown, in the interior of a central axle serving as rotational axis X—X. Connections 28, 29 (one connection is not visible) in the interior of the central axle are coupled, via a sealing system 30, with stationary vacuum connections 31, 32, 33 outside the central axle. The vacuum supply is completed by valves 34, 35, 36 provided at the feed side and associated vacuum sensors 37, 38, 39 and throttles 40, 41, 42. A throttle 43 is provided for venting the vacuum holding devices 24, 25, 26. A lifting cylinder 45 which is controlled via throttles 44 serves for the required vertical adjustment of the changer 11 during the changing process. A sensor 46, shown in FIG. 4, controls the lift which is indicated via a connecting link 47.

A sensor 48 and a signal disk 49 form a coding device according to FIG. 5 for the aimed for rough positioning of the changer 11. The rotation of the changer 11 initiated by the motor 22 during the initialization process is monitored by means of the sensor 48 and a reference point on the signal disk 49. A step counter, not shown, which is connected with an encoder 51 arranged at the rear axle end of the motor 22 (see FIG. 3) is reset when the reference point is reached. Further monitoring and control of the rotating movement is effected by means of the path information supplied by the encoder 51.

For increased reliability, the signal disk 49 is provided with windows 52 in addition to the reference point. In addition to the location information concerning the three work stations 12, 13, 14 and the intermediate position of the station 15, the instantaneous assignment of the three changer arms 16, 17, 18 to the work stations 12, 13, 14 is also signaled as a result of a three-track arrangement of the windows 52 in connection with a three-track optoelectronic sensor 53.

In order to achieve the required positioning accuracy when transferring objects 3 between the work stations 12, 13, 14, the changer 11 comprises means for reproducible positioning in a reference position in addition to the step drive for rough positioning. A pair of toothed-rack portions 54, 55 which are displaceable relative to one another engage in a toothed wheel 56 of identical pitch divisible by three, which toothed wheel 56 is fitted to the central axle. The toothed-rack portions 54, 55 are portions of gripping elements 57, 58 of a parallel gripper 59 which is extendable in a direction perpendicular to its effective line of force and which is rotatable about an axis Y—Y which is directed parallel to the rotational axis X—X in the opposite direction of the gripping elements 57, 58 in a bearing 60. The bearing 60 is guided on a linear guide 62 in a direction 61 towards and away from the rotational axis X—X. Resilient coupling elements 63 provide for the mounting and proper positioning of the parallel gripper 59 and permit an unimpeded rotation of the changer 11 in the non-gripping state. This technical solution ensures a nonconstraining introduction of force to the toothed wheel 56 of the central axle and a reproducible securing of the latter.

In order to eliminate pitch errors, objects 3 are always transferred from one work station to the other by means of the same changer arm.

Another possibility consists in determining the systematic error between the three changer arms and allowing for this error in the positioning of the work station. The systematic angular error which can occur in this type of operation is corrected by an appropriate offset value in the orientation of the object 3.

Since the freedom of movement is restricted in many cases by the receiving elements of the individual work stations and exclusively rotational movement is not possible, a linear movement is superimposed on the rotational movement in the respective reference position. For this purpose, a receiving element which is movable in the radial direction is located on each of the three changer arms 16, 17, 18. Normally, this receiving element is fixed (clamping or spring). A linear movement can be introduced in one or more reference positions of the changer 11 by means of one or more stationary drives.

In order to isolate against vibrations, the handling unit and the inspection microscope are arranged on a common base plate which is a component part of a vibration isolation system.

The manner of operation of the device is explained with reference to an example for the transport of an object 3. After the placement or changing of the magazine containers 6, 7 at an ergonomic loading height in plane E1, the two indexing devices are moved out of the loading height into plane E2 in the region of the handling plane by means of the elevator drives 10.

During this vertical movement of the indexing devices, the magazine containers 6, 7 are opened and inventory is taken in the two indexing devices after the upper end position is reached. The inventory serves to determine the quantity of objects contained in the magazines and to determine the position of the objects 3 or free magazine shelves relative to the handling plane. After inventory, the contents are reported to an overriding computer and the objects 3 to be inspected can be selected.

A first object 3 is removed from the input and output station 1 by means of the transporting arm 4 and is transported to the first work station 12. Like the changer arms 16, 17, 18, the two transporting arms 4, 5 have vacuum holding devices. The vacuum holding device located at transporting arm 4 is vented when the first work station 12 is reached so that the object 3 is transferred. Since the present case concerns an aligning station, orientation of the object 3 in the x-y plane and angular orientation are effected after the object 3 has been sucked in. The second work station 13, a microscope table, moves into a changing position corresponding to the concentric position of all work stations relative to the rotational axis X—X. The aligned object and an object located on the microscope table are taken up by means of an upward movement of the changer 11 by means of the lifting cylinder 45. Both objects are fixed at the rear side by the vacuum holding device at the respective changer arm.

During the subsequent 120-degree rotation of the changer 11, one object is transported from the aligning station to the microscope table and the other object is transported from the microscope table to the additional work station 14 simultaneously. The vacuum is turned off at both vacuum holding devices and the objects are transferred to the respective work station by a downward movement.

The changing time is reduced to a minimum by the simultaneous changing of objects by means of one changing movement.

During the subsequent inspection period, the object is transported by the transporting device 5 from work station 14 to the input and output device 2. For this purpose, the vacuum of the vacuum holding device is switched on and the object is taken over from work station 14 accompanied by a simultaneous upward movement and is deposited into the selected magazine shelf The next object is transported to the aligning station simultaneously.

The transport path for the objects 3 which is described here is only an example. It will be clear from the illustration of the transporting arms in dashed lines, among other things, that a great many different transport paths can also be realized with the device according to the invention in a flexible manner. Station 15 is also used for this purpose in particular, as was described above. The objects can be exchanged optionally by means of the changer 11 which is rotatable in both directions.

Moreover, it is possible for the station 15 which is provided here only as an intermediate depositing place to be used as a work station for sorting and mixing the objects.

After the last object has been inspected, both magazines are moved into the magazine containers 6, 7. The magazine containers 6, 7 are locked and the indexing devices are simultaneously moved into the loading height again.

While the foregoing description and drawings represent the preferred embodiments of the present invention, it will be obvious to those skilled in the art that various changes and modifications may be made therein without departing from the true spirit and scope of the present invention.

What is claimed is:

1. In an arrangement for handling wafer-shaped objects with at least one indexing device for supplying and accepting the objects at a supplying and accepting location situated in a handling plane and at least one transporting device for transporting the wafer-shaped objects between the supplying and accepting location and a work station, the improvement comprising:

a changer;

a first work station and at least one other work station arranged so as to be substantially coaxial to a central point through which passes a rotational axis of said changer; and a pair of toothed-rack portions for reproducible positioning of the changer, said toothed-rack portions being displaceable relative to one another and individually engaging a toothed wheel fitted to a central axle on a rotational axis of said changer to effect rotation thereof, and wherein teeth on said toothed-rack portions and teeth on said toothed wheel have identical pitches.

2. The arrangement according to claim 1, wherein said changer includes a plurality of changer arms and a step drive for rough positioning as well as means for reproducible positioning in at least one reference position for the purpose of a highly precise positioning of said changer arms at the work stations in order to transfer objects from one work station to the other.

3. The arrangement according to claim 2, wherein rough positioning is effected via a coding device by which the location information relating to the work stations and the positions of the changer arms relative to the work stations is determined by multiple-track coding.

4. The arrangement according to claim 2, further comprising a vacuum feed to vacuum hold devices at said changer arms in an interior of a central axle located at the rotational axis of said changer, wherein connections in the interior of the central axle are coupled, via a sealing system, with stationary vacuum connections outside the central axle.

5. The arrangement according to claim 1, wherein the toothed-rack portions are gripping elements of a parallel gripper which is extendable in a direction perpendicular to its effective line of force and which is rotatable about an axis which is directed parallel to the rotational axis of said charger in the opposite direction of the gripping elements in a bearing which is guided on a linear guide towards and away from said rotational axis.

6. The arrangement according to claim 1, wherein each of said at least one indexing device is fitted to a vertically adjustable platform for vertical movement between two planes which are situated one above the other, wherein one plane lies at an ergonomic loading height and the other plane lies in the region of the handling plane.

7. The arrangement according to claim 6, wherein the sides of each of said at least one indexing device is guided in a sealing labyrinth system.

* * * * *